(12) United States Patent  
Tokunaga

(10) Patent No.: US 8,055,964 B2  
(45) Date of Patent: Nov. 8, 2011

(54) SEMICONDUCTOR DEVICE HAVING PLURAL CLOCK DOMAINS WHICH RECEIVE SCAN CLOCK IN COMMON

(75) Inventor: Kouki Tokunaga, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 153 days.

(21) Appl. No.: 12/588,225

(22) Filed: Oct. 8, 2009

(65) Prior Publication Data

US 2010/0107024 A1    Apr. 29, 2010

(30) Foreign Application Priority Data

Oct. 28, 2008    (JP) ................................. 2008-276373

(51) Int. Cl.
*G01R 31/28* (2006.01)
(52) U.S. Cl. .................... 714/729; 714/730; 714/731
(58) Field of Classification Search .................. None
See application file for complete search history.

(56) References Cited

U.S. PATENT DOCUMENTS 7,134,061 B2 * 11/2006 Agashe et al. ................ 714/726
2006/0026476 A1    2/2006 Nishida

FOREIGN PATENT DOCUMENTS

JP    2006-38743    2/2006

OTHER PUBLICATIONS

Kwang-Ting Cheng, Partial Scan Designs Without Using a Separate Scan Clock, 1995, IEEE.*

* cited by examiner

*Primary Examiner* — Jeffrey A Gaffin
*Assistant Examiner* — Guerrier Merant
(74) *Attorney, Agent, or Firm* — McGinn IP Law Group, PLLC

(57) ABSTRACT

A semiconductor device, includes a plurality of scan chains for testing a plurality of clock domains whose operating frequencies are different from one another, each of the plurality of scan chains including a plurality of flip-flop circuits, a clock oscillator which generates a plurality of clock signals corresponding to respective operating frequencies that are used to test the plurality of clock domains, a scan clock signal input circuit which receives, from an outside, and a scan clock signal that is supplied to the plurality of scan chains. The semiconductor device further includes a pulse generation circuit unit which generates a clock pulse signal used for the testing based on the clock signal and the scan clock signal, the pulse generation circuit unit including a plurality of pulse generation circuits corresponding to respective operating frequencies, a clock control circuit unit which selectively activates a part of the pulse generation circuit in the pulse generation circuit unit, the clock control circuit including a plurality of logic circuits corresponding to the plurality of scan chains, respectively, and a clock control signal generation unit which generates a clock control signal to control the clock control circuit unit, based on the scan clock signal.

12 Claims, 10 Drawing Sheets

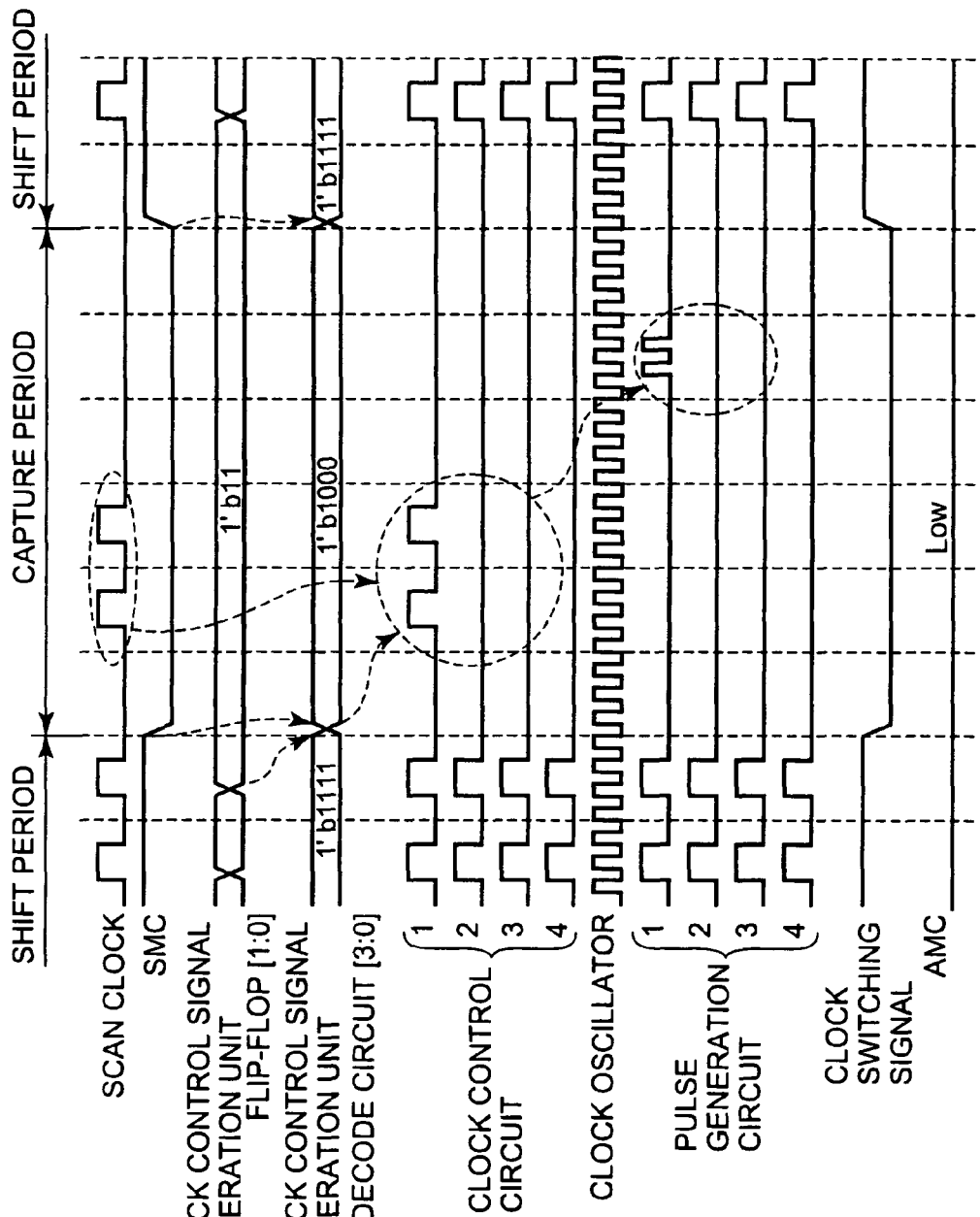

US 8,055,964 B2

SEMICONDUCTOR DEVICE HAVING PLURAL CLOCK DOMAINS WHICH RECEIVE SCAN CLOCK IN COMMON

INCORPORATION BY REFERENCE

The application is based upon and claims the benefit of priority from Japanese Patent Application No. 2008-276373 which was filed on Oct. 28, 2008, the disclosure of which is incorporated herein in its entirety by reference.

BACKGROUND OF THE INVENTION

1. Field of the Invention

The present invention relates to a semiconductor device and a method for testing the semiconductor device, and more specifically, to a semiconductor device having plural clock domains whose operating frequencies are different from one another and a method for testing the semiconductor device.

2. Description of Related Art

In a field of scan path test of the semiconductor device, with microfabrication technique of the semiconductor process, it has become that sufficient quality can no longer be maintained only with the single stuck-at fault model that has been used for a long time.

In order to maintain sufficient quality of the semiconductor device, it has become indispensable to consider also transition delay fault and path delay fault. Moreover, it has become necessary to consider new faults, such as bridge fault and SDQM (Statistical Delay Quality Model).

Although the use of these additional tests makes it possible to secure the quality, on the other hand, a test cost has considerably increased.

Reduction of the test cost is an essential problem. As solution means, with execution of a multiple parallel test, necessity of performing the single stuck-at test and a delay test at an actual operating frequency with fewer test terminals has increased.

In relation to the above, Patent Document (Japanese Patent Application Laid Open No. 2006-38743) discloses description related to a semiconductor integrated circuit device and a test device of it. The related technology will be explained.

FIG. 1 is a schematic diagram for explaining configurations of the semiconductor device (LSI: Large Scale Integrated circuit) according to the related technology disclosed in the Patent Document and of a test board 1 for performing the delay test by a scan path method on the semiconductor device.

The test board 1 has a clock oscillator 3. The semiconductor device 2 has a PLL (Phase-Locked Loop) circuit 4, a pulse generation circuit 5, a scan clock signal input part SCK, a multiplexer circuit 6, and a scan path test circuit 7. The pulse generation circuit 5 has a pulse number control circuit 8 and a pulse selection circuit 9.

The pulse generation circuit 5 generates a clock SCK0 for the delay test whose pulse number is based on the scan clock SCK. The scan path test circuit 7 tests the integrated circuit of the semiconductor device with the clock SCK0 for the delay test.

In an example of FIG. 1, even if the test board 1 is capable of generating only a clock signal whose frequency is low, a clock signal of a high frequency required for the delay test can be generated in the inside of an LSI 2.

A capture operation of the scan test will be explained. The scan clock signal input part SCK is inputted with the number of clock pulses required for the capture operation of the scan path test circuit 7.

As many pulses of the clock SCK0 for the delay test as the clock pulses inputted from the scan clock SCK are extracted from the PLL clock that was multiplied by a PLL 4 using the pulse generation circuit 5. Subsequently, the capture operation of the scan path test circuit 7 is performed using the clock SCK0 for the delay test.

Therefore, the delay test based on the PLL clock operating frequency is possible regardless of a frequency of the scan clock SCK.

Functions of circuits used in the semiconductor integrated circuit device of FIG. 1 will be explained below.

The clock oscillator 3 is a circuit of generating and outputting a test clock signal of a predetermined cycle. The test clock signal that the clock oscillator 3 generates is outputted toward the LSI 2.

The PLL 4 is a circuit that is inputted with the test clock generated by the clock oscillator 3, multiplies its frequency, shapes its waveform, does others, and subsequently outputs it as a PLL clock signal (PLL_CLK).

FIG. 2 is a circuit diagram for explaining a detailed configuration of the pulse generation circuit 5. The pulse generation circuit 5 has the pulse number control circuit 8 and the pulse selection circuit 9. Operations of the pulse generation circuit 5 will be explained by dividing them into operations of the pulse number control circuit 8 and operations of the pulse selection circuit 9.

The pulse number control circuit 8 is a circuit that is inputted with a Control signal and a scan clock signal SCK, and memorizes the number of the clock pulses that the pulse generation circuit 5 should output. The pulse number control circuit 8 counts the pulse number of the scan clock signal SCK in response to the Control signal that is a control signal from the outside.

The pulse selection circuit 9 is a circuit that extracts a clock signal SCK0 for the delay test from the PLL clock signal (PLL_CLK) multiplied by the PLL 4. In response to START_PULSE that is the control signal inputted from the outside, the pulse selection circuit 9 starts to output the clock SCK0 for the delay test, and selects and outputs the clock signal latched in the pulse number control circuit 8. For example, after START_PULSE changed from 0 to 1, it outputs as many clock SCK0 for the delay test as the number of pulses having been set up in the pulse number control circuit 8.

A multiplexer 6 is a selection circuit of two inputs and one output. In the figure, the multiplexer 6 is inputted with the scan clock SCK and the clock SCK0 for the delay test, selects either of them, and outputs it toward the scan path test circuit 7. Incidentally, the multiplexer 6 switches the signal that is selected in response to the control signal inputted from the outside.

FIG. 3 is a timing chart in the case of generating 2PULSE in the pulse generation circuit 5. Using FIG. 3, an operation of the pulse generation circuit in the delay test using a PLL clock will be explained.

When generating the desired clock SCK0 for the delay test, first, the PLL 4 is initialized. Then, the PLL 4 multiples the test clock inputted from the clock oscillator 3 to generate a fast clock PLL_CLK.

Subsequently, the control signal of the pulse generation circuit 5 is changed into "0" from "1," changing the operational mode of the LSI 2 to a counter mode ((a) in FIG. 3). Subsequently, a pulse of the scan clock SCK is inputted and a shift operation is performed by the pulse number control circuit 8.

Thereby, the number of inputted pulses is counted and is set up in the pulse number control circuit 8 ((b) in FIG. 3). That is, PULSE_ON becomes "1" following a first pulse of the scan clock SCK, and 2PULSE becomes "1" following a second pulse of the scan pulse clock SCK. The number of pulses being set up becomes the pulse number of the clock SCK0 for the delay test.

SUMMARY

With the above-mentioned related technology, in order to perform a delay test at an actual operating frequency on plural clock domains, as many (or more) scan clock terminals than the clock domains are required. In other words, if the number of scan clock terminals is fewer than the number of frequencies that are different for every clock domain, then the delay test will not be able to be performed. Especially, in a semiconductor integrated circuit device in which only one scan clock terminal can be installed, there is a problem that with the related technology, the delay test at the actual operating frequency cannot be performed for the plural clock domains.

Generally, a reason of occurrence of the problem lies in that plural clock domains whose operating frequencies are different from one another exist in the inside of the semiconductor integrated circuit.

In the case of performing the delay test at the actual operating frequency in the semiconductor integrated circuit in which plural clock domains exist, a pulse generation circuit is required for every clock domain. Similarly, as many scan clock terminals as the number of clock domains become required. For this reason, the delay test cannot be implemented with one scan clock terminal.

Indeed, it is not impossible to supply the scan clock to plural pulse generation circuits from a single scan clock terminal. However, in this case, the plural clock domains will operate simultaneously. As a result, delivery of data between different clock domains occurs, and a path in which a setup time and a hold time cannot be guaranteed will operate, which will cause expectation disagreement.

In this way, in the semiconductor device according to the related technology, the delay test cannot be performed with only one scan clock terminal.

A semiconductor device according to an exemplary aspect of the present invention has plural scan chains (271-278), a clock oscillator (23), a scan clock signal input part (215), a pulse generation circuit unit (25), a clock control circuit unit (22), and a clock control signal generation unit (21). Here, the plural scan chains (271-278) are for testing the plural clock domains whose operating frequencies are different from one another, respectively. The plural scan chains are equipped with the plural flip-flop circuits (271-278), respectively. The clock oscillator (23) is for generating the clock signals corresponding to respective operating frequencies that are used to test the plural clock domains. The scan clock signal input part (215) is for allowing a scan clock signal that is supplied to the plural scan chains (271-278) to input thereinto from the outside. The pulse generation circuit unit (25) is for generating the clock pulse signal that is used in the test based on the clock signal and the scan clock signal. The pulse generation circuit unit (25) has the pulse generation circuits (251-254) corresponding to respective operating frequencies. The clock control circuit unit (22) is for selectively activating a part of the pulse generation circuits (251-254) in the pulse generation circuit unit (25). The clock control circuit unit (22) has plural logic circuits (225-228) corresponding to the plural scan chains, respectively. The clock control signal generation unit (21) generates a clock control signal for controlling the clock control circuit unit (22) based on the scan clock signal. The number of the scan clock signal input parts (215) is fewer than the number of the plural clock domains.

A semiconductor test method according to an exemplary aspect of the present invention is a method for testing a semiconductor device having the plural clock domains whose operating frequencies are different from one another. The semiconductor test method includes: (a) generating clock signals of operating frequencies each corresponding to each of the plural clock domains; (b) inputting the scan clock signal for specifying an object that is tested among the plural clock domains from the outside; (c) generating the clock control signal for specifying a clock signal that is used for a test based on the scan clock signal; (d) controlling the clock control circuit unit (22) based on the clock control signal; (e) selectively activating a part of the pulse generation circuits (251-254) according to a state of the clock control circuit unit (22); (f) generating a clock pulse signal that is used in the test based on the clock signal and the scan clock signal; and (g) testing the clock domain corresponding to the active pulse generation circuit (251-254) using the clock pulse signal. The number of the scan clock signals is fewer than the number of the plural clock domains.

In the exemplary aspects of the present invention, a test circuit for clock control is inserted into each of clock lines of plural existing user modes. With the configuration, a value of a register that exists in the inside of the test circuit is controlled using a scan path test. The clock domain that is a test object is controlled by the register value.

With the present invention, configured as described above in the semiconductor integrated circuit in which plural test clock terminals for scan path test cannot be provided, it is possible to generate a pattern such that plural clock domains are tested separately at respective frequencies.

BRIEF DESCRIPTION OF THE DRAWINGS

The above and other exemplary aspects, advantages and features of the present invention will be more apparent from the following description of certain exemplary embodiments taken in conjunction with the accompanying drawings, in which:

FIG. 5 is a timing chart for explaining an operation of the semiconductor device according to the present invention, i.e., a semiconductor device test method according to the present invention;

DETAILED DESCRIPTION OF THE EXEMPLARY EMBODIMENTS

First Exemplary Embodiment

Figure 4A:
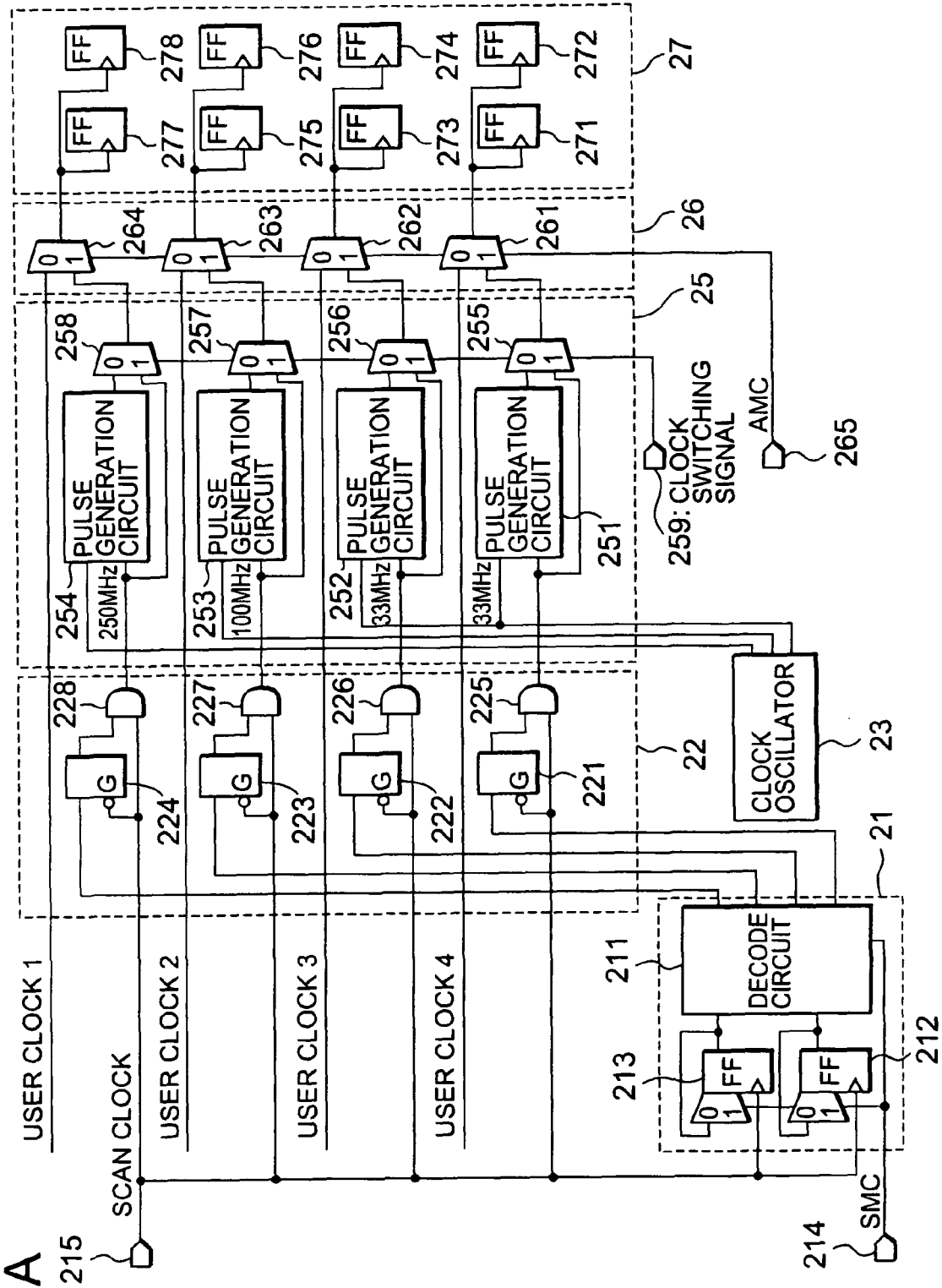
FIG. 4A is a circuit diagram for explaining a configuration of a test circuit unit of the semiconductor device according to a first exemplary embodiment of the present invention.

FIG. 4A is a circuit diagram for explaining a configuration of a test circuit unit of a semiconductor device according to a first exemplary embodiment of the present invention.

The test circuit unit has a clock control signal generation unit 21, a clock control circuit unit 22, a clock oscillator 23, a pulse generation circuit unit 25, a multiplexer unit 26, and a scan path test circuit 27.

The clock control signal generation unit 21 includes a decode circuit 211 and two flip-flops 212, 213. Incidentally, the number of flip-flops is strictly one example, and is not limited to two.

The clock control circuit unit 22 has four retiming circuits 221-224 and four AND circuits 225-228. Here, each of the four retiming circuits 221-224 may be a latch circuit. Incidentally, the numbers of the retiming circuits and of the AND circuits are strictly one example, and are not limited to four.

The pulse generation circuit unit 25 has four pulse generation circuits 251-254, four multiplexers 255-258, and a clock switching signal input part 259. Incidentally, the numbers of the pulse generation circuits and of the multiplexers are strictly one example, and are not limited to four.

The multiplexer unit 26 includes four multiplexers 261-264 and an AMC signal input part 265. Incidentally, the number of multiplexers is strictly an example, and is not limited to four.

The scan path test circuit 27 has eight flip-flops 271-278. Here, the two flip-flops 271 and 272, the two flip-flops 273 and 274, the two flip-flops 275 and the 276, and the two flip-flops 277 and 278 are making pairs, respectively. That is, the scan path test circuit 27 consists of a total of four scan chains. Incidentally, the number of the flip-flops in one scan chain is strictly an example, and is not limited to two.

A scan clock signal input part 215 is connected to first input parts in each of the two flip-flops 212, 213, first input parts in each of the four retiming circuits 221-224, and first input parts in each of the four AND circuits 225-228.

A second input part of the flip-flop 212 is connected with an output part of the multiplexer. A first input part of the multiplexer is connected with an output part of the flip-flop 212. A switching signal input part of the multiplexer is connected with an SMC (Scan Mode Control) signal input part 214.

The flip-flop 213 is connected to another multiplexer in a loop-like manner similarly with the flip-flop 212. Moreover, a switching signal input part of the multiplexer is also connected with the SMC signal input part 214.

Output parts of the two flip-flops 212,213 are connected to the first and second input parts of the decode circuit 211, respectively. A switching signal input part of the decode circuit 211 is connected with the SMC signal input part 214. Four output parts of the decode circuit 211 are connected to second input parts of the four retiming circuits 221-224, respectively.

Output parts in the respective four retiming circuits 221-224 are connected to second input parts of the four AND circuits 225-228, respectively. An output part in each of the four AND circuits 225-228 is connected to both a first input part in each of the four pulse generation circuits 251-254 and a first input part in each of the four multiplexers 255-258.

Each output part of the clock oscillator 23 is connected to a second input part in each of the four pulse generation circuits 251-254. Incidentally, in the example of FIG. 4A, since the two pulse generation circuits 251 and 252 use the clock signal of the same frequency, they are connected to the same output part of the clock oscillator 23.

An output part in each of the four pulse generation circuits 251-254 is connected to a second input part in the four multiplexers 255-258. Output parts in the four multiplexers 255-258 are connected to respective first input parts of the four multiplexers 261-264. The clock switching signal input part 259 is connected to the switching signal input part in each of the four multiplexers 255-258.

A second input part in each of the four multiplexers 261-264 is connected with each of the four user clock input parts. An output part in each of the four multiplexers 261-264 is connected to an input part in each of the eight flip-flops 271-278 in the scan path test circuit 27. That is, an output part of the multiplexer 261 is connected to an input part in each of the two flip-flops 271, 272. An output part of the multiplexer 262 is connected to an input part in each of the two flip-flops 273, 274. An output part of the multiplexer 263 is connected to an input part in each of the two flip-flops 275, 276. An output part of the multiplexer 264 is connected to an input part in each of the two flip-flops 277, 278. The switching signal input part in each of the four multiplexers 261-264 is connected with the AMC signal input part 265.

The output part in each of the eight flip-flops 271-278 in the scan path test circuit 27 is connected to an input part in four unillustrated scan chains.

FIG. 5 is a timing chart for explaining an operation of the semiconductor device according to the present invention, i.e., the semiconductor device test method according to the present invention.

The horizontal axis of the timing chart shows lapse of time, and a shift period and a capture period are arranged alternately.

The vertical axis of the timing chart shows intensities of signals, which shows, sequentially from the top: a scan clock signal with which the scan clock input part 215 is inputted; a signal of the SMC signal input part 214; a decode circuit input signal that the flip-flops 212 and 213 in the clock control signal generation unit 21 output; a clock control signal that the decode circuit 211 in the clock control signal generation unit 21 outputs; output signals from the four AND circuits 225-228 in the clock circuit unit 22; an output signal of the clock oscillator 23; output signals from the four multiplexers 255-258 in the pulse generation circuit unit 25; a signal of the clock switching signal input part 259; and a signal of the AMC signal input part 265.

The shift period will be explained. As a shift operation, a scan data input signal for controlling the clock control circuit unit 22 made up of the flip-flops 212, 213 is stored from the scan data input part that is an unillustrated external terminal. This is the same operation as the shift operation of the scan chain of the internal logic in the test circuit unit of the semiconductor device according to the related technology. In the example, a signal "11" is supplied to the clock control signal generation unit flip-flop.

The capture period will be explained. As a capture operation, first the two flip-flops 212, 213 output the decode circuit input signals based on the stored value, and the decode circuit input signal is supplied to the decode circuit 211. The decode circuit 211 generates the clock control signal for being supplied to the clock control circuit unit 22 in response to the decode circuit input signals. The clock control signal is supplied to a second input part in each of the four retiming circuits 221-224.

As a basic configuration, only one output of the decode circuit 211 becomes active, and other outputs become inactive in the capture period. However, this is a setup for testing only one clock domain at a time. If plural clock domains can be tested at a time, then the plural outputs may become active simultaneously. Moreover, in the shift period, all the outputs become active.

Only the clock control circuit such that the control signal supplied from the decode circuit 211 takes an active value becomes active, and other clock control circuits become inactive.

Therefore, the clock signal is not impressed except the clock domains where the clock control circuit is active. However, regarding the plural clock domains that are mutually independent, i.e., having no paths connecting one another, it is possible to test them simultaneously. This is effective from a viewpoint of test time shortening. For this purpose, what is necessary is to make the output signals of the decode circuit 211 common, supply the output signal to plural corresponding clock control circuit units 22, and impress the clock signal to the plural clock domains simultaneously.

The pulse generation circuit unit 25 is supplied with the scan clock signal supplied from the scan clock signal input part 215 that is an external terminal through the clock control circuit unit 22. More precisely, only the retiming circuit and the AND circuit that correspond to the clock control circuit that has become active by being impressed with the clock signal among the pulse generation circuit unit 25 are inputted with the above-mentioned scan clock signal.

Each of the pulse generation circuits 251-254 in the pulse generation circuit unit 25 extracts as many pulse signals as that of the scan clock signal supplied from the scan clock signal input part 215 that is an external terminal from the clock supplied from the clock oscillator 23, and output them toward the scan path test circuit 27.

Figure 1:
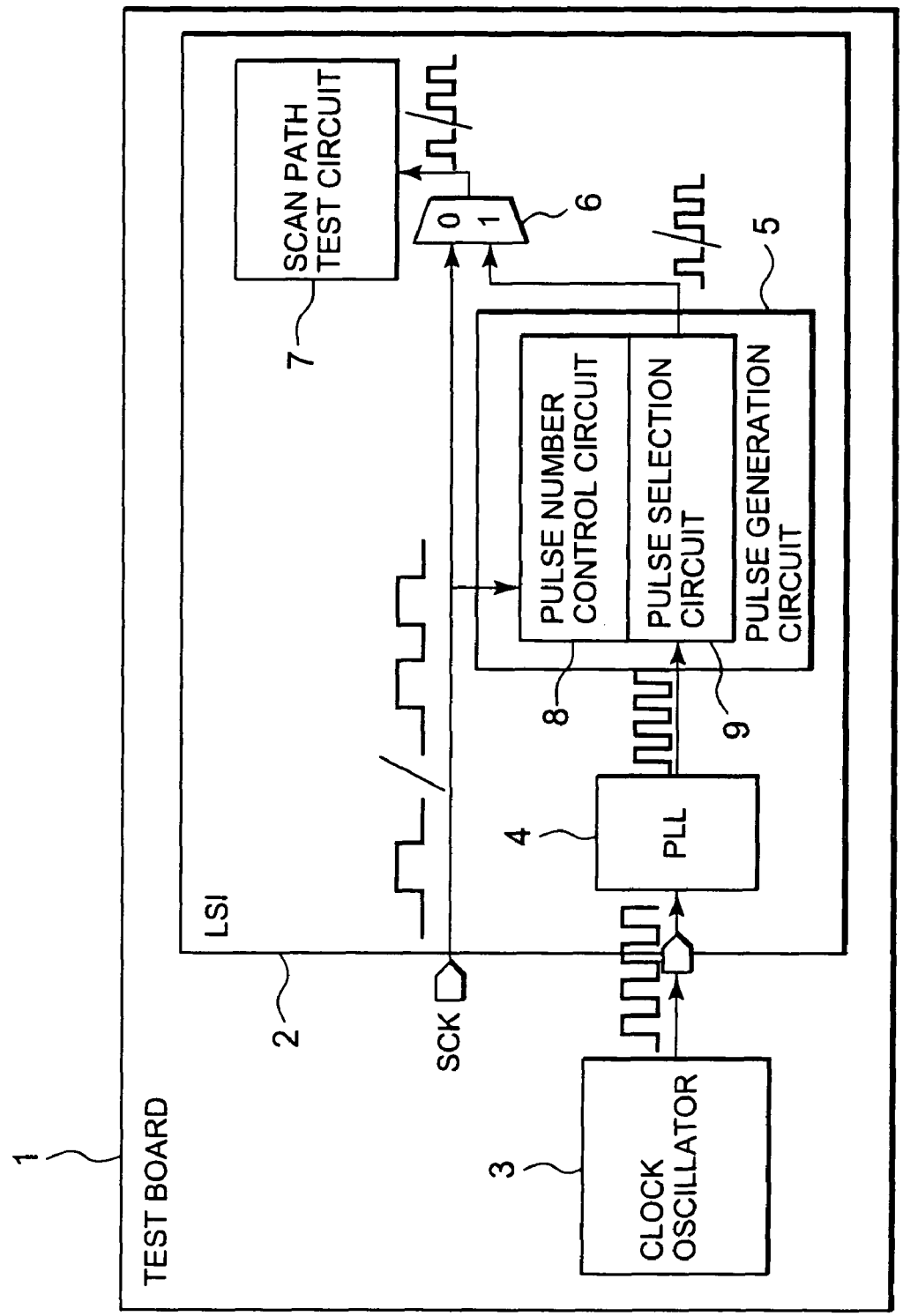
FIG. 1 is a schematic diagram for explaining structures of a semiconductor device according to a related technology and of a test board for performing a delay test by a scan path method on a semiconductor device.
Figure 2:
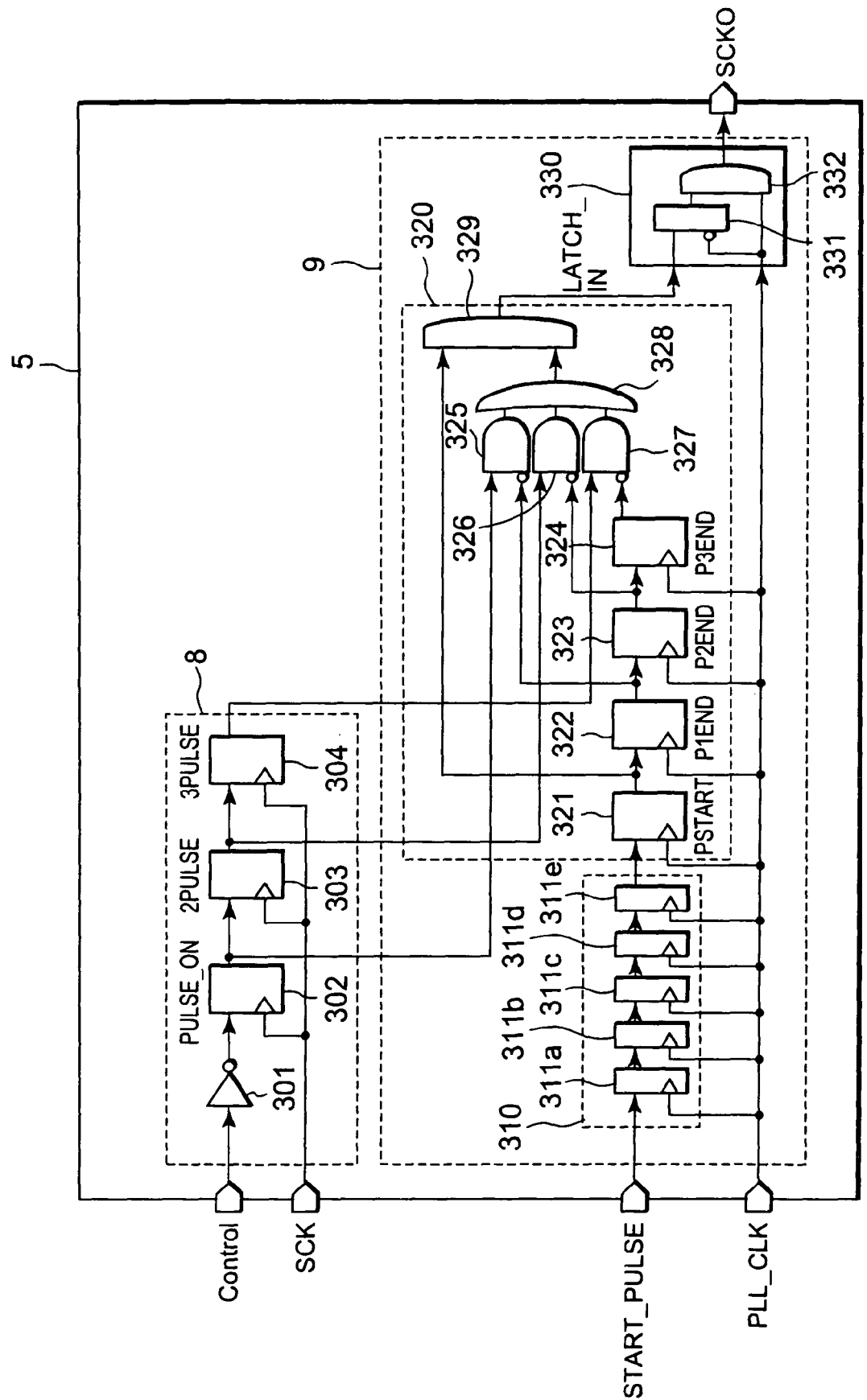
FIG. 2 is a circuit diagram for explaining a detailed configuration of a pulse generation circuit according to the related technology.
Figure 3:
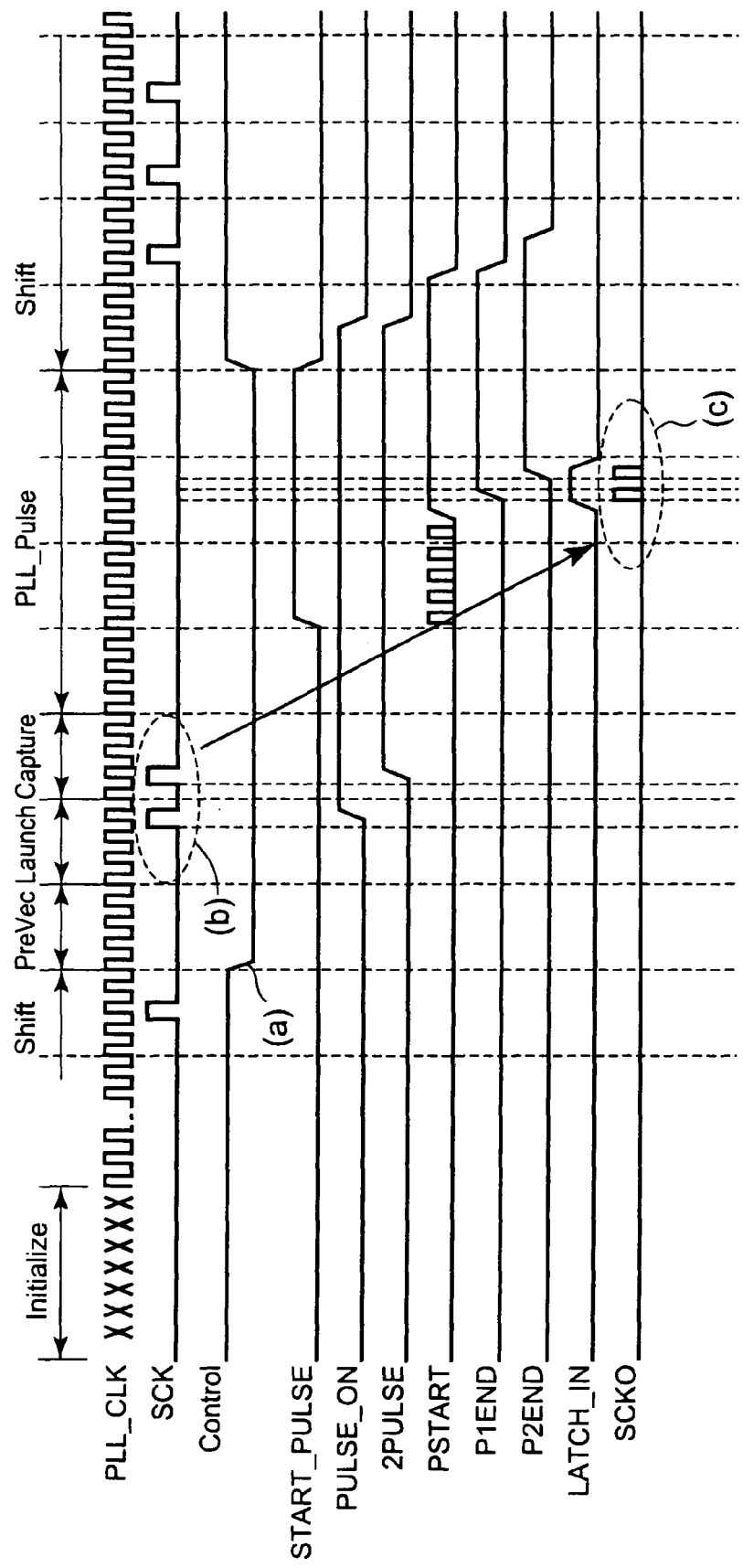
FIG. 3 is a timing chart in the case of generating 2PULSE in the pulse generation circuit according to the related technology.

Here, each of the pulse generation circuits 251-254 may be of the same configuration as that of FIG. 2 disclosed in Patent Document 1, for example. As described above, a pulse generation circuit 5 of FIG. 2 has a pulse number control circuit 8 and a pulse selection circuit 9. In order to explain operations of the pulse generation circuits 251-254, the operation of the pulse generation circuit 5 is divided into an operation of the pulse number control circuit 8 and an operation of the pulse selection circuit 9, and the explanation will be given again.

The pulse number control circuit 8 is a circuit that is inputted with a Control signal and a scan clock signal SCK and memorizes a pulse number that the pulse generation circuit 5 should output. The pulse number control circuit 8 counts the pulse number of the scan clock signal SCK in response to the Control signal that is a control signal from the outside.

The pulse selection circuit 9 is a circuit that extracts a clock signal SCK0 for a delay test from a PLL clock signal (PLL_CLK) multiplied by a PLL 4. In response to START PULSE that is a control signal inputted from the outside, the pulse selection circuit 9 starts to output a clock SCK0 for the delay test, and selects and outputs the clock signal being latched in the pulse number control circuit 8. For example, after START_PULSE changed from 0 to 1, it outputs the clock SCK0 for the delay test as much as the pulse number having been set up in the pulse number control circuit 8.

In the delay test, two pulses are generally required. In this case, in the present invention, the scan clock signal of two pulses supplied from the scan clock signal input part 215 that is an external terminal is supplied to the pulse generation circuit unit 25 through the clock control circuit unit 22.

The pulse generation circuit unit 25 extracts two pulses from the fast clock supplied from the clock oscillator 23 based on the two-pulse clock supplied from the scan clock signal input part 215 that is an external terminal, and outputs them toward the scan path test circuit 27.

The four multiplexers 255-258 connected to the clock switching signal input part 259 have a function of switching and outputting either of the scan clock signal supplied to the pulse generation circuit unit 25 or the clock signal outputted from the pulse generation circuit unit 25.

In the capture period of the delay test that needs the clock signal of an actual operating frequency, the four multiplexers 255-258 output the clock pulse signal outputted from the pulse generation circuit unit 25. In the shift period and in the capture period of a single stuck-at fault test for which a low speed clock may be used, the four multiplexers 255-258 output the scan clock signals that will be supplied to the pulse generation circuit unit 25.

The four multiplexers 261-264 connected to the AMC signal input part 265 have a function of switching and outputting either of the user clock signal or the test clock signal for scan test. At the time of the scan test, the AMC signal is fixed to a High state or a Low state so that the four multiplexers 261-264 may output the test clock for scan test.

Figure 6:
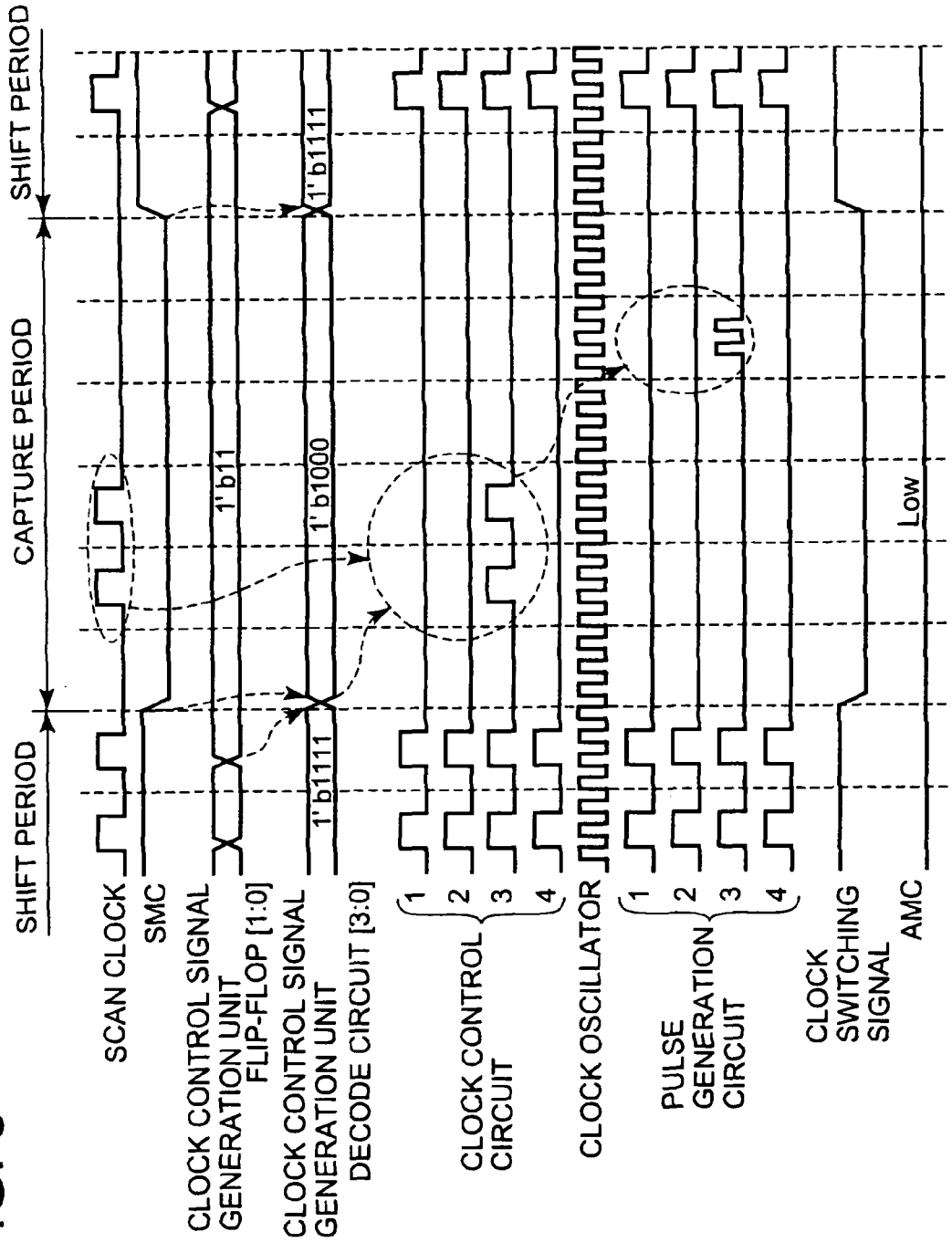
FIG. 6 is another timing chart for explaining the operation of the semiconductor device, i.e., the semiconductor test method according to the present invention.

FIG. 6 is another timing chart for explaining an operation of the semiconductor device according to the present invention, i.e., the semiconductor device test method according to the present invention. The timing chart is the same as shown by FIG. 5 except an event that a signal "01" is supplied to a flip-flop of the clock control signal generation unit, and as a result a third clock domain is active, and therefore its detailed explanation is omitted.

As explained above, according to the present invention, in the shift operation, a value is set up to the flip-flops 212-213 in the clock control signal generation unit 21 for controlling operations of the clock domains. Based on the set-up value, in the capture operation, the decode circuit 211 selects a clock domain in which the capture operation is made valid. By the clock control circuit corresponding to the clock domain being activated, the clock pulse signal is supplied to the flip-flops 271-278 of the scan path test circuit 27. Incidentally, at the time of the single stuck-at fault test, the scan clock signal supplied from the scan clock signal input part 215 is supplied to the flip-flops 271-278 of the scan path test circuit 27. Moreover, at the time of the delay test, using the specified pulse clock supplied from the scan clock signal input part 215 terminal as a trigger, the pulse generation circuit unit 25 extracts the clock of specified pulses from the clock signals supplied from the clock oscillator 23, and supplies them to the flip flops 271-278 of the scan path test circuit 27.

Figure 7:
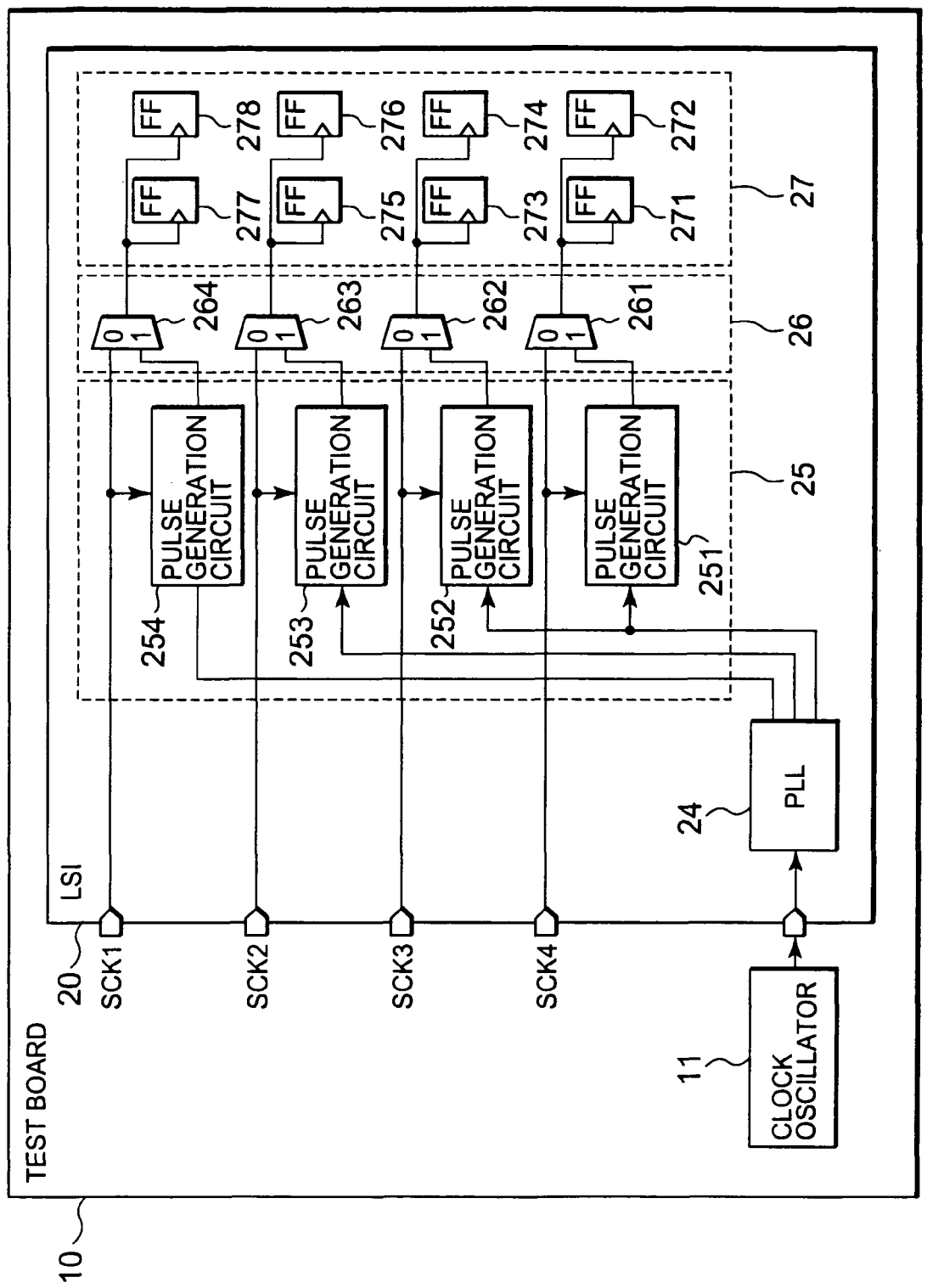
FIG. 7 is a circuit diagram of a test circuit unit of the semiconductor device according to the related technology that is especially expressed in a form matched to the present invention.

FIG. 7 is a circuit diagram of the test circuit unit in the semiconductor device according to the related technology that is shown especially in a manner matched to the present invention. Thus, the related technology needs as many scan clock input parts SCK1 to SCK4 as the plural clock domains whose operating frequencies are different from one another.

However, according to the exemplary embodiment of the present invention, even if the number of the scan clock signal input part 215 is only one, the delay test at the actual operating frequency to the plural clock domains is implementable.

Second Exemplary Embodiment

Figure 4B:
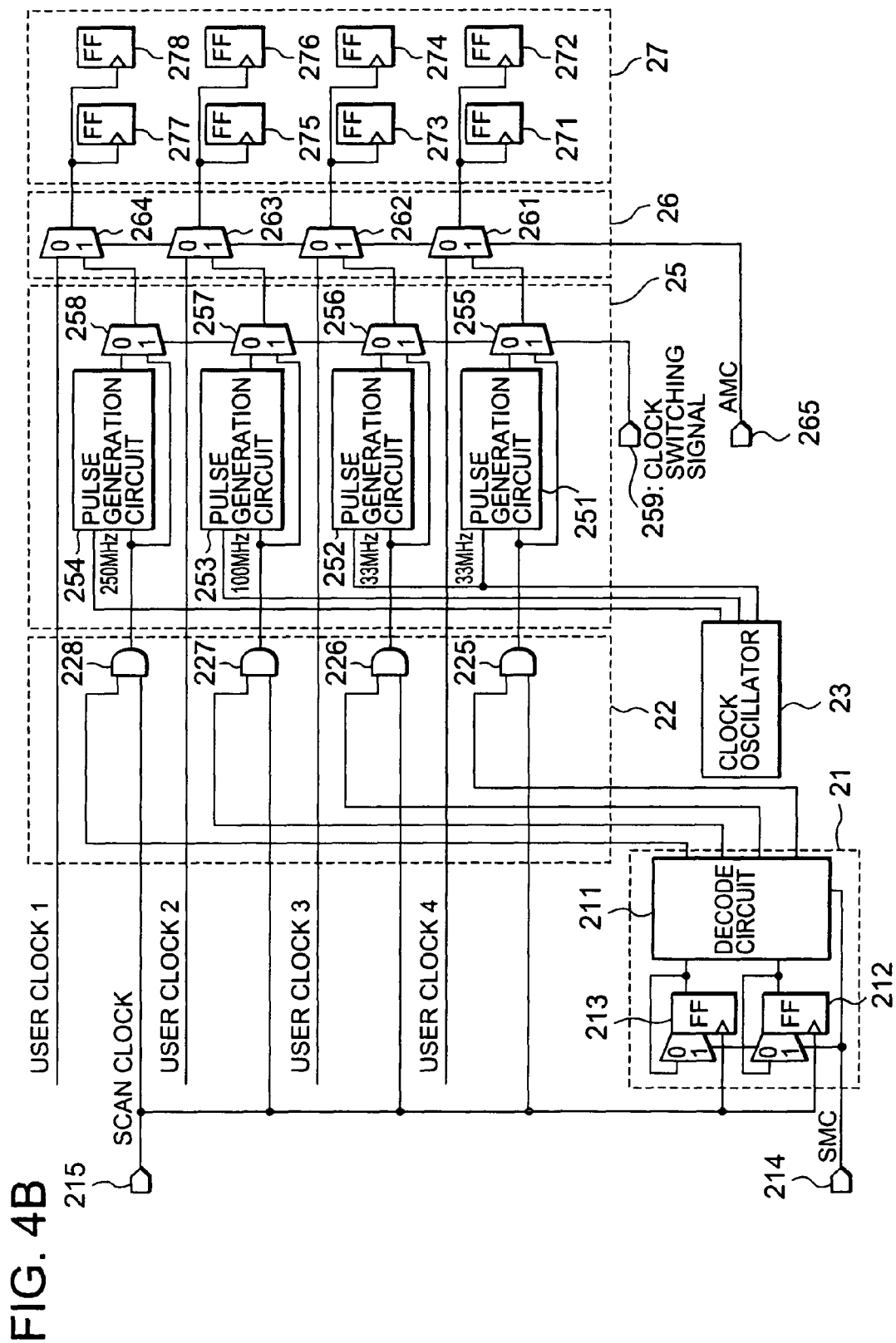
FIG. 4B is a circuit diagram for explaining a configuration of a test circuit unit of the semiconductor device in a second exemplary embodiment of the present invention.

FIG. 4B is a circuit diagram for explaining a configuration of a test circuit unit of the semiconductor device in a second exemplary embodiment of the present invention. The configuration of the semiconductor device in the exemplary embodiment is almost the same as the configuration of the semiconductor device in the first exemplary embodiment of the present invention, and what is different is the clock control circuit unit 22. That is, the semiconductor device according to the exemplary embodiment is equal to the semiconductor device according to the first exemplary embodiment in which the retiming circuits 221-224 are omitted. Since a role of each stage of the clock control circuit unit 22 is enough if another input signal can control with another input signal whether an arbitrary input signal is outputted, the omission is possible.

Incidentally, a first input part in each of the AND circuits 225-228 of the semiconductor device according to the exemplary embodiment is connected with the scan clock signal input part 215. Moreover, a second input part in each of the AND circuits 225-228 is connected with each of four output parts of the decode circuit 211.

Since other configurations and connections of the semiconductor device according to the exemplary embodiment are the same as those of the semiconductor device according to the first exemplary embodiment, their detailed explanations are omitted.

Moreover, the retiming circuits 221-224 are omitted. However, since an operation of the semiconductor device according to the exemplary embodiment is the same as the case of the first exemplary embodiment, its detailed explanation is omitted. However, in the exemplary embodiment, unlike the first exemplary embodiment, the clock control signal that the decode circuit 211 outputs is not latched by the clock control circuit unit 22. Only in this point is it necessary to change the output operation of the decode circuit 211 from the case of the first exemplary embodiment.

Third Exemplary Embodiment

Figure 4C:
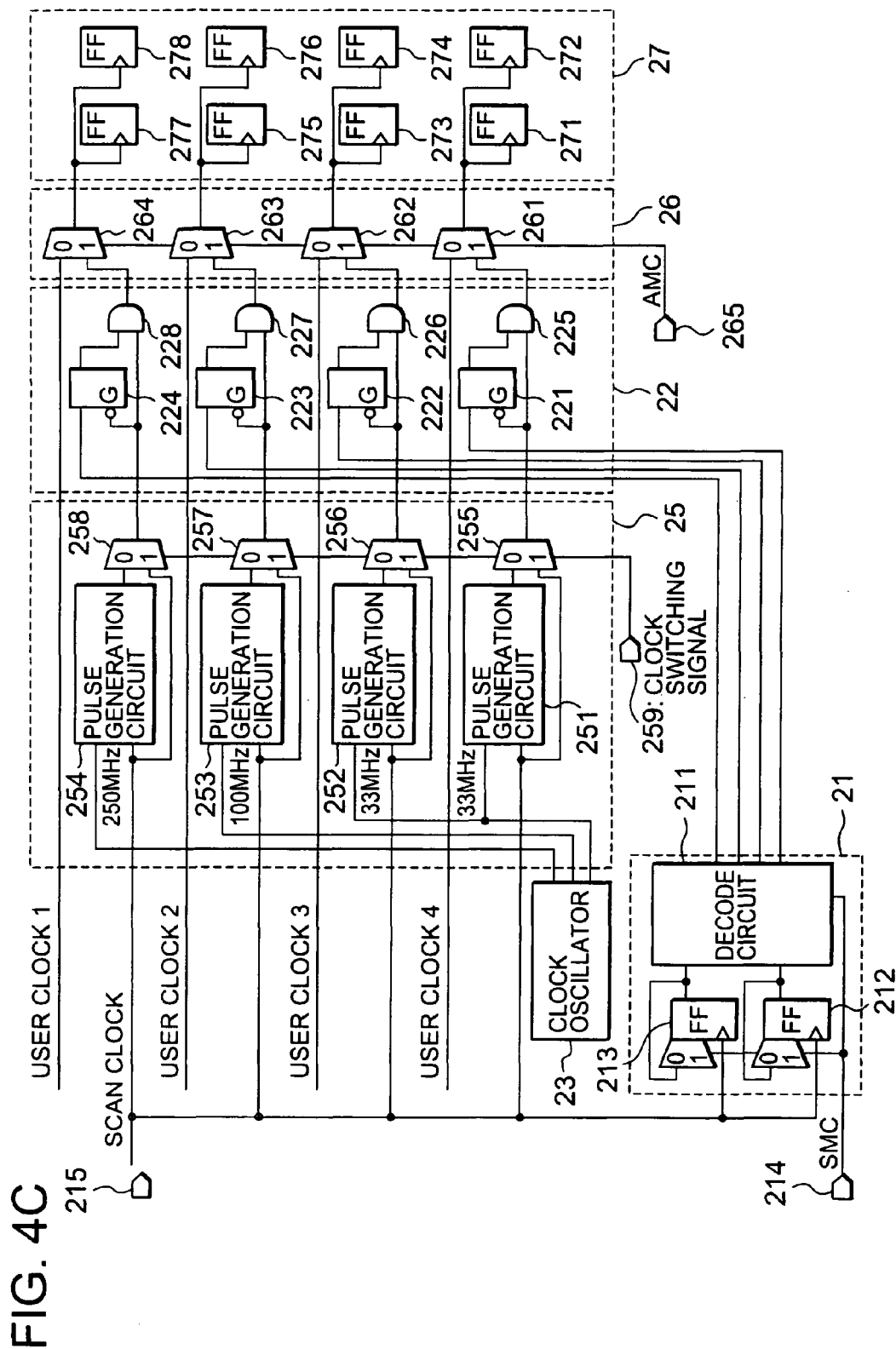
FIG. 4C is a circuit diagram for explaining a configuration of a test circuit unit of the semiconductor device in a third exemplary embodiment of the present invention.

FIG. 4C is a circuit diagram for explaining a configuration of a test circuit unit of the semiconductor device in a third exemplary embodiment of the present invention.

The configuration of the semiconductor device in the exemplary embodiment is almost the same as the configuration of the semiconductor device in the first exemplary embodiment of the present invention, and what is different is only a spatial relation of the clock control circuit unit 22 and the pulse generation circuit unit 25. That is, in the first exemplary embodiment, the pulse generation circuit unit 25 is connected to the downstream side of the clock control circuit unit 22. In the third exemplary embodiment, however, the pulse generation circuit unit 25 is connected to the upper stream side of the clock control circuit unit 22.

A connection relation concerning inputs/outputs of the pulse generation circuit unit 25 and the clock control circuit unit 22 in the exemplary embodiment will be explained. The scan clock signal input part 215 is connected to a first input part in each of the pulse generation circuits 251-254. Plural output parts of the clock oscillator 23 are connected to second input parts in each of the pulse generation circuits 251-254, respectively.

An output part in each of the pulse generation circuits 251-254 is connected to a first input part in each of the multiplexers 255-258. A second input part in each of the multiplexers 255-258 is connected with the scan clock signal input part 215. An output part in each of the multiplexers 255-258 is connected to a first input part in each of the AND circuits 225-228 and a first input part in each of the retiming circuits 221-224.

An input part in each of the retiming circuits 221-224 is connected to each output part of the decode circuit 211. An output part in each of the retiming circuits 221-224 is connected to a second input part in each of the AND circuits 225-228. An output part in each of the AND circuits 225-228 is connected to a first input part in each of the multiplexers 261-264.

A second input part in each of the multiplexers 261-264 is connected to each of four user clock signal input parts. An output part in each of the multiplexers 261-264 is connected to each of input parts of the eight flip-flops 271-278 in the scan path test circuit 27.

Since the other configurations, connection relations, and operations of the semiconductor device according to the exemplary embodiment are the same as those of the semiconductor device according to the first exemplary embodiment, their detailed explanations are omitted.

Fourth Exemplary Embodiment

Figure 4D:
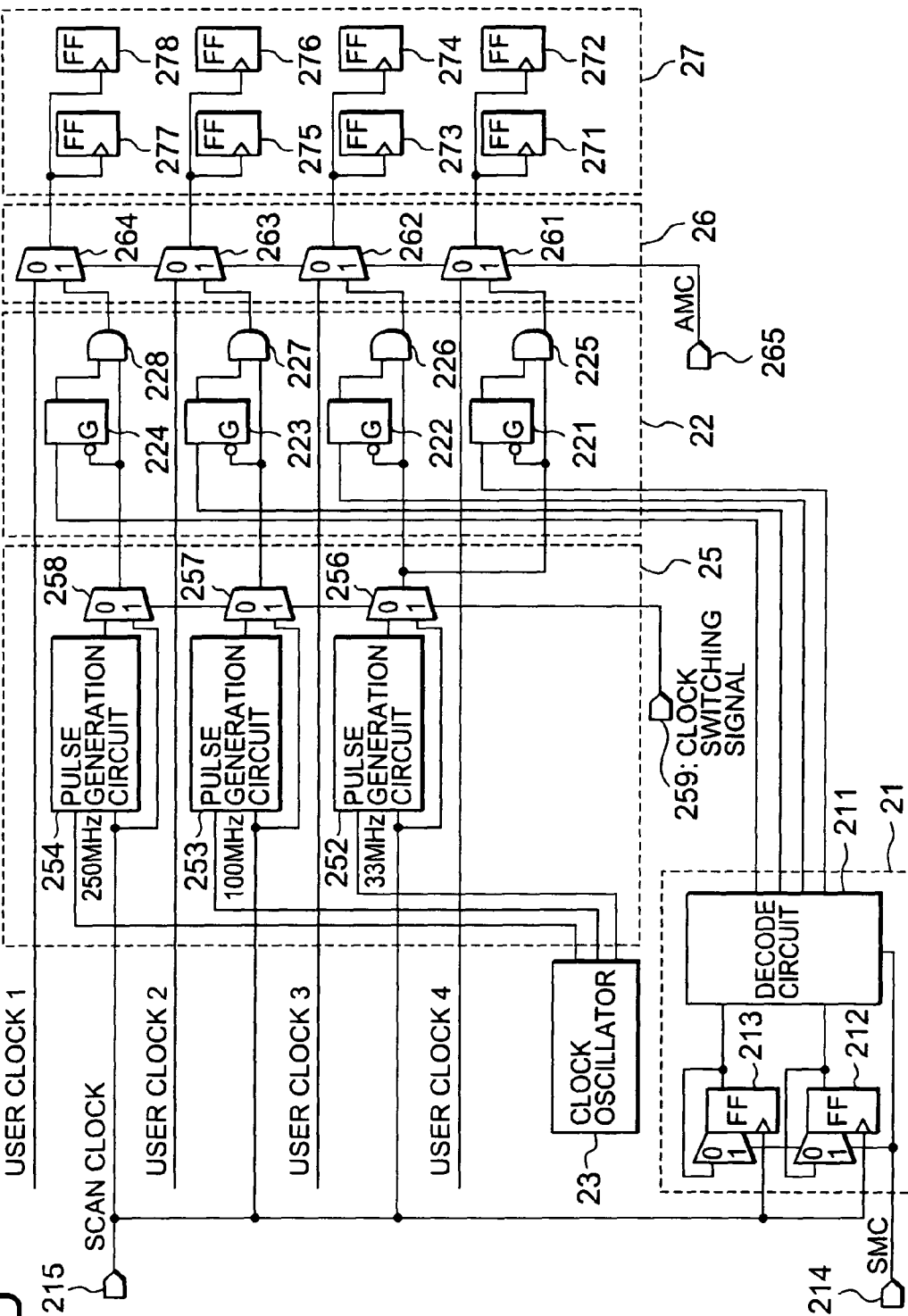
FIG. 4D is a circuit diagram for explaining a configuration of a test circuit unit of the semiconductor device in a fourth exemplary embodiment of the present invention.

FIG. 4D is a circuit diagram for explaining a configuration of a test circuit unit of the semiconductor device in a fourth exemplary embodiment of the present invention.

A configuration of the semiconductor device in the exemplary embodiment is almost the same as the configuration of the semiconductor device in the third exemplary embodiment of the present invention, and what is different is only that the pulse generation circuit 251 is omitted. In the third exemplary embodiment, both of the two pulse generation circuits 251 and 252 generate pulses of the same frequency. Then, in the exemplary embodiment, by the pulse generation circuit 252 also playing the role of the pulse generation circuit 251, it becomes possible to omit the pulse generation circuit 251. Incidentally, the clock control circuit unit 22 controls an event, to which clock domain a pulse that the pulse generation circuit 252 outputs is sent.

The connection relation concerning the input/output of the pulse generation circuit 252 in the exemplary embodiment will be explained. An output part of a multiplexer 256 connected to the downstream side of the pulse generation circuit 252 is connected to a first input part in a retiming circuit 222 and a first input part in an AND circuit 226. The output part of the multiplexer 256 connected to the downstream side of the pulse generation circuit 252 is further connected also to a first input part in the retiming circuit 221 and a first input part in the AND circuit 226.

Since other configurations, connection relations and operations of the semiconductor device according to the exemplary embodiment are the same as those of the semiconductor device according to the third exemplary embodiment, their detailed explanations are omitted.

It is possible to freely combine each exemplary embodiment of the present invention explained in the foregoing within a range being technically consistent. For example, the configuration in which the retiming circuits 221-224 are omitted in the second exemplary embodiment is also applicable to the third exemplary embodiment or the fourth exemplary embodiment.

Moreover, the test circuit units in the semiconductor device of the present invention may be plural. As a result, the number of the scan clock signal input parts 215 in the semiconductor device of the present invention is not necessarily unity, and nevertheless there is still no change in that it is still fewer than the number of clock domains.

Further, it is noted that Applicant's intent is to encompass equivalents of all claim elements, even if amended later during prosecution.

What is claimed is:

1. A semiconductor device, comprising: a plurality of scan chains for testing a plurality of clock domains whose operating frequencies are different from one another, each of the plurality of scan chains including a plurality of flip-flop circuits; a clock oscillator which generates a plurality of clock signals corresponding to respective operating frequencies that are used to test the plurality of clock domains; a scan clock signal input circuit which receives, from an outside, a scan clock signal that is supplied to the plurality of scan chains; a pulse generation circuit unit which generates a clock pulse signal used for the testing based on the clock signals and the scan clock signal, the pulse generation circuit unit including a plurality of pulse generation circuits corresponding to respective operating frequencies; a clock control circuit unit which selectively activates a part of a pulse generation circuit in the pulse generation circuit unit, the clock control circuit including a plurality of logic circuits corresponding to the plurality of scan chains, respectively; and a clock control signal generation unit which generates a clock control signal to control the clock control circuit unit, based on the scan clock signal, wherein a number of the scan clock signal input circuit is fewer than a number of the plurality of clock domains.

2. The semiconductor device according to claim 1, wherein the clock control signal generation unit includes:
a plurality of flip-flop circuits each for converting a scan data input signal supplied from the outside to be used for a shift operation into a decode circuit input signal; and
a decode circuit which generates the clock control signal based on the decode circuit input signal.

3. The semiconductor device according to claim 1, wherein the number of the scan clock signal input circuit is unity.

4. The semiconductor device according to claim 1, wherein the clock control circuit unit includes a plurality of clock control circuits that are connected to an upper stream side of the plurality of logic circuits, respectively.

5. The semiconductor device according to claim 4, wherein each of the plurality of clock control circuits includes a latch circuit.

6. The semiconductor device according to claim 1, wherein the clock control circuit unit is connected to an upper stream side of the pulse generation circuit unit.

7. The semiconductor device according to claim 1, wherein the clock control circuit unit is connected to a downstream side of the pulse generation circuit unit.

8. The semiconductor device according to claim 7, wherein, when operating frequencies of two clock domains among the plurality of clock domains are the same, two scan chains corresponding to the two clock domains among the plurality of scan chains are connected to the downstream side of a same pulse generation circuit in the pulse generation circuit unit.

9. A method of testing a semiconductor device equipped with a plurality of clock domains whose operating frequencies are different from one another, the method comprising: generating a plurality of clock signals of operating frequencies corresponding to a plurality of clock domains, respectively; receiving a scan clock signal for specifying an object that is tested among the plurality of clock domains from an outside of the semiconductor device; generating a clock control signal for specifying the clock signals that are used for the testing based on the scan clock signal; controlling a clock control circuit unit based on the clock control signal; selectively activating a part of a pulse generation circuit according to a state of the clock control circuit unit; generating a clock pulse signal that is used in the testing based on the clock signals and the scan clock signal; and conducting the testing of the clock domain corresponding to the pulse generation circuit activated, using the clock pulse signal, wherein a number of the scan clock signals is fewer than a number of a plurality of clock domains.

10. The semiconductor device test method according to claim 9, wherein the number of the scan clock signal is unity.

11. The semiconductor device test method according to claim 9, wherein the conducting the testing includes:
when operating frequencies of two clock domains among the plurality of clock domains are the same, using a same clock pulse signal.

12. The semiconductor device test method according to claim 9, wherein the generating the clock control signal includes:
converting a scan data input signal supplied from the outside for a shift operation into a decode circuit input signal; and
generating the clock control signal based on the decode circuit input signal.

* * * * *